United States Patent
Myung et al.

(10) Patent No.: US 12,317,690 B2
(45) Date of Patent: May 27, 2025

(54) DISPLAY DEVICE AND METHOD OF MANUFACTURING SAME

(71) Applicant: LG DISPLAY CO., LTD., Seoul (KR)

(72) Inventors: Jaehwan Myung, Paju-si (KR); Hyeongseok Kim, Paju-si (KR)

(73) Assignee: LG Display Co., Ltd. (KR)

( * ) Notice: Subject to any disclaimer, the term of this patent is extended or adjusted under 35 U.S.C. 154(b) by 526 days.

(21) Appl. No.: 17/555,787

(22) Filed: Dec. 20, 2021

(65) Prior Publication Data
US 2022/0208906 A1    Jun. 30, 2022

(30) Foreign Application Priority Data
Dec. 31, 2020    (KR) .................. 10-2020-0189040

(51) Int. Cl.
*H01L 27/32*    (2006.01)
*H10K 59/122*    (2023.01)
*H10K 71/00*    (2023.01)
*H10K 59/12*    (2023.01)

(52) U.S. Cl.
CPC ........... *H10K 59/122* (2023.02); *H10K 71/00* (2023.02); *H10K 59/1201* (2023.02)

(58) Field of Classification Search
None
See application file for complete search history.

(56) References Cited

U.S. PATENT DOCUMENTS

| | | | |
|---|---|---|---|
| 11,056,544 B1* | 7/2021 | Wei | H10K 59/353 |
| 11,538,869 B2* | 12/2022 | Kim | H10K 59/88 |
| 2016/0329530 A1* | 11/2016 | Park | H01L 21/308 |
| 2023/0013050 A1* | 1/2023 | Zhang | H10K 59/122 |
| 2023/0088386 A1* | 3/2023 | Kim | H10K 59/122 |
| | | | 257/40 |
| 2024/0276777 A1* | 8/2024 | Yan | H10K 59/122 |

FOREIGN PATENT DOCUMENTS

| | | |
|---|---|---|
| KR | 20140042223 A | 4/2014 |
| KR | 2018-0066556 A | 6/2018 |
| KR | 2018-0076792 A | 7/2018 |
| KR | 20190066198 A | 6/2019 |

OTHER PUBLICATIONS

Office Action in Korean Appln. No. 10-2020-0189040, mailed on Apr. 4, 2025, 11 pages (with English translation).

* cited by examiner

*Primary Examiner* — Long Pham
(74) *Attorney, Agent, or Firm* — Fish & Richardson P.C.

(57) ABSTRACT

A display device includes a substrate on which a plurality of pixels are disposed; a bank defining emission areas of the plurality of pixels; and an emission layer formed in each of the emission areas, wherein the bank includes a first bank extended in row and column directions; a second bank disposed on the first bank and extended in the column direction to separate adjacent pixel columns; and a third bank disposed on the second bank, wherein the first bank is hydrophilic, and each of the second bank and the third bank has a hydrophobic upper surface.

12 Claims, 16 Drawing Sheets

(a)

(b)

(a)

(b)

(a)

(b)

(a)

(b)

(a)

(b)

DISPLAY DEVICE AND METHOD OF MANUFACTURING SAME

CROSS-REFERENCE TO RELATED APPLICATION

The present application claims priority to Korean Patent Application No. 10-2020-0189040, filed on Dec. 31, 2020, which is hereby incorporated by reference in its entirety for all purposes.

BACKGROUND

Field of the Disclosure

The present disclosure relates to a display device and a method of manufacturing the same. Although the present disclosure is suitable for a wide scope of applications, it is particularly suitable for providing a display device that can resolve a problem of thickness difference in an emission layer of an organic light emitting element manufactured through a solution process and improving flatness, and providing a method of manufacturing the same.

Description of the Background

With the development of information-based society, various types of display devices are being developed. Recently, various display devices such as liquid crystal displays (LCDs), plasma display panels (PDPs), and organic light emitting displays (OLEDs) have been used.

An organic light emitting element constituting an organic light emitting display is a self-luminous element and does not require a separate light source, thus reducing the thickness and weight of the organic light emitting display. In addition, the organic light emitting display exhibits high quality characteristics such as low power consumption, high luminance, and high reaction speed.

Recently, a technology for forming an emission layer of the organic light emitting element through a solution process using an inkjet device has been developed. The solution process is performed by applying a solution for forming the emission layer in a set region and then drying the solution.

The foregoing is intended merely to aid in the understanding of the background of the present disclosure, and is not intended to mean that the present disclosure falls within the purview of the related art that is already known to those skilled in the art.

SUMMARY

Accordingly, the present disclosure has been made keeping in mind the above problems and is to provide a display device capable of resolving a difference in thickness of an emission layer of an organic light emitting element manufactured through a solution process and improving flatness, and provide a method of manufacturing the display device.

The present disclosure is also to provide a display device including a hydrophilic bank, a first hydrophobic bank disposed on the hydrophilic bank, and a second hydrophobic bank disposed on the first hydrophobic bank, and provide a method of manufacturing the same display device.

In order to achieve the above, according to one aspect of the present disclosure, there is provided a display device including a substrate on which pixels are disposed; a bank defining emission areas of the pixels; and an emission layer formed in each of the emission areas. The bank may include: a first bank extending in a row direction and a column direction to define the emission areas; a second bank disposed on the first bank and extending in the column direction to separate adjacent pixel columns; and a third bank disposed on the second bank.

The first bank may be hydrophilic, and each of the second bank and the third bank may have a hydrophobic upper surface.

The third bank may have a T shape in which an upper portion thereof has a larger area than a lower portion thereof, and a first hole may be formed between the second bank and the upper portion of the third bank.

An edge portion of the emission layer may be formed inside the first hole and may have a surface height higher than that of a central portion of the emission layer.

The edge portion and the central portion may be continuous or separated from each other at the periphery of the second bank.

The edge portion of the emission layer may be in contact with a side surface of the second bank.

The display device may further include a fourth bank formed on the second bank to be spaced apart from the third bank. The first hole may be surrounded by the second bank, the upper portion of the third bank, and the fourth bank.

An edge portion of the emission layer may be formed inside the first hole and may have a surface height higher than that of a central portion of the emission layer.

The edge portion and the central portion may be continuous or separated from each other on an upper surface of the fourth bank.

The second bank may have a T shape in which an upper portion thereof has a larger area than a lower portion thereof, and a second hole may be formed between the first bank and the upper portion of the second bank.

An edge portion of the emission layer may be formed inside the second hole and may have a surface height higher than that of a central portion of the emission layer.

Each of the first bank and the third bank may have a tapered shape having an inclined side surface.

According to another aspect of the present disclosure, there is provided a method of manufacturing a display device, the method including: forming, on a substrate, a first bank extending in a row direction and a column direction to define emission areas of pixels; forming, on the first bank, a second bank extending in the column direction to separate adjacent pixel columns; forming a third bank on the second bank; and forming an emission layer by applying an organic light emitting material on the emission areas of the pixels.

The forming of the third bank may include: forming, on the substrate, a buffer layer covering the second bank; forming an opening through which at least a portion of the second bank is exposed; forming, on the substrate, an organic insulating layer covering the second bank; patterning the organic insulating layer so that only a portion covering the opening remains; and removing the buffer layer to form the third bank.

The forming of the organic insulating layer may be performed to fill the opening with a portion of the organic insulating layer.

The patterning of the organic insulating layer may be performed such that the portion covering the opening has a larger area than the opening.

The third bank may have a T shape in which an upper portion thereof has a larger area than a lower portion thereof, the portion of the organic insulating layer filling the opening may constitute the lower portion, and the portion covering the opening may constitute the upper portion.

The forming of the emission layer may be performed such that the organic light emitting material flows into a hole formed between the second bank and the upper portion of the third bank, and the emission layer may be configured such that an edge portion thereof is formed inside the hole and has a surface height higher than that of a central portion thereof.

The edge portion and the central portion may be continuous or separated from each other at the periphery of the second bank.

The method may further include performing a photolithography process after the patterning of the organic insulating layer. During the photolithography process, a hydrophobic material contained in the organic insulating layer may move to an upper surface thereof.

The display device according to the aspects can improve the surface flatness of the emission layer formed through the solution process, thereby improving the light emission efficiency of the organic light emitting element.

BRIEF DESCRIPTION OF THE DRAWINGS

The above and other features and other advantages of the present disclosure will be more clearly understood from the following detailed description when taken in conjunction with the accompanying drawings, in which.

DETAILED DESCRIPTION

Figure 1:
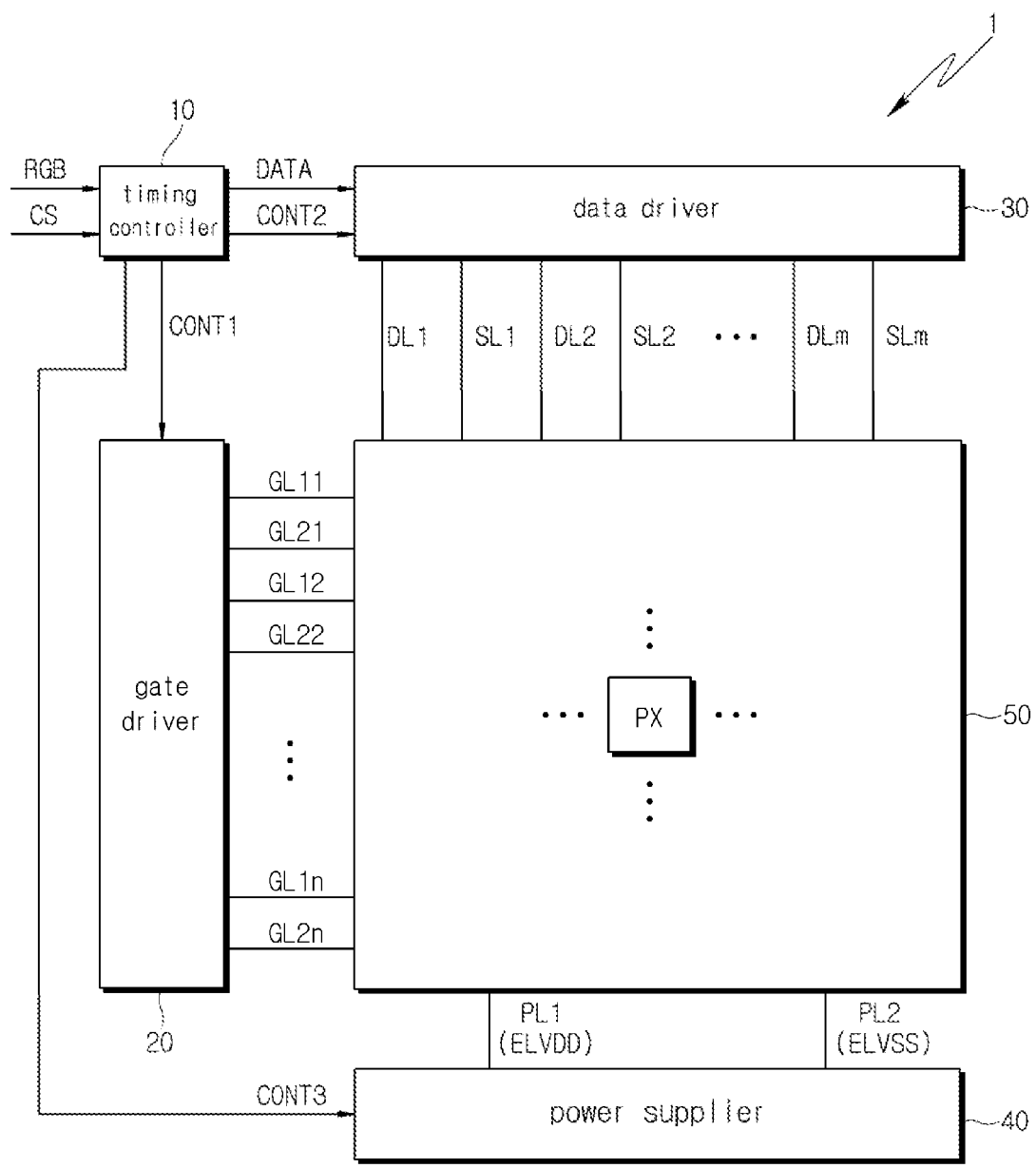
FIG. 1 is a block diagram illustrating the configuration of a display device according to the present disclosure.

Hereinafter, aspects will be described with reference to the accompanying drawings. Throughout the present specification, in a case where an element (or a region, a layer, a portion, etc.) is described as being "on", "connected to", or "coupled to" another element, this means that the element may be connected/coupled directly to the other element or that a third constituent element may be disposed therebetween.

The same reference numeral refers to the same or like elements. Also, in the drawings, the thickness, proportion, and dimension of the elements are exaggerated for effective description of technical content. The term "and/or" includes one or more combinations that may be defined by the associated configurations.

Although the terms first, second, etc. may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element. As used herein, the singular forms are intended to include the plural forms as well, unless the context clearly indicates otherwise.

The terms "under", "below", "over", "above", etc. are used to describe the relationship of the elements illustrated in the drawings. These terms have relative concepts and are described with reference to directions indicated in the drawings.

The terms "comprise" or "have" used in this specification, specify the presence of stated features, processes, operations, components, parts, or a combination thereof, but do not preclude the presence or addition of one or more other features, numerals, processes, operations, components, parts, or a combination thereof.

FIG. 1 is a block diagram illustrating a configuration of a display device according to an aspect of the present disclosure.

Referring to FIG. 1, the display device 1 includes a timing controller 10, a gate driver 20, a data driver 30, a power supplier 40, and a display panel 50.

The timing controller 10 may receive an image signal RGB and a control signal CS from the outside. The image signal RGB may include a plurality of pieces of gradation data. The control signal CS, for example, may include a horizontal synchronization signal, a vertical synchronization signal, and a main clock signal.

The timing controller 10 may process the image signal RGB and the control signal CS to be suitable for an operating condition of the display panel 50 and may generate and output image data DATA, a gate drive control signal CONT1, a data drive control signal CONT2, and a power supply control signal CONT3.

The gate driver 20 may be connected to pixels PX of the display panel 50 through a plurality of first gate lines GL11 to GL1n. The gate driver 20 may generate gate signals on the basis of the gate drive control signal CONT1 that is output from the timing controller 10. The gate driver 20 may provide the generated gate signals to the pixels PXs through the plurality of first gate lines GL11 to GL1n.

In various aspects, the gate driver 20 may be further connected to the pixels PX of the display panel 50 through a plurality of second gate lines GL21 to GL2n. The gate driver 20 may provide a sensing signal to the pixels PXs through the plurality of second gate lines GL21 to GL2n. The sensing signal may be supplied to measure the characteristics of a drive transistor and/or a light emitting element that are provided within each of the pixels PXs.

The data driver 30 may be connected to the pixels PX of the display panel 50 through a plurality of data lines DL1 to DLm. The data driver 30 may generate data signals on the basis of the image data DATA and the data drive control signal CONT2 that are output from the timing controller 10. The data driver 30 may provide the generated data signals to the pixels PXs through the plurality of data lines DL1 to DLm.

In various aspects, the data driver 30 may be further connected to the pixels PX of the display panel 50 through a plurality of sensing lines SL1 to SLm (or reference lines). The data driver 30 may provide a reference voltage (or a sensing voltage or an initialization voltage) to the pixels PXs through the plurality of sensing lines SL1 to SLm or may sense the states of the pixels PXs on the basis of electric signals fed back from the pixels PXs.

The power supplier 40 may be connected to the pixels PX of the display panel 50 through a plurality of power lines PL1 and PL2. The power supplier 40 may generate a driving voltage to be provided to the display panel 50 on the basis of the power supply control signal CONT3. The drive voltage, for example, may include a high potential driving voltage ELVDD and a low potential driving voltage ELVSS. The power supplier 40 may provide the generated drive voltages ELVDD and ELVSS to the pixels PX through the corresponding power lines PL1 and PL2, respectively.

A plurality of pixels PXs (or referred to as sub-pixels) are arranged in the display panel 50. The pixels PXs, for example, may be arranged in a matrix form on the display panel 50.

Each of the pixels PX may be electrically connected to a corresponding gate line and a corresponding data line. The pixels PXs may emit light at luminance levels corresponding to gate signals and data signals that are supplied through the first gate lines GL11 to GL1$n$ and the data lines DL1 to DL$m$, respectively.

Each of the pixels PX may display any one of first to third colors. In an aspect, each of the pixels PXs may display any one of red, green, blue colors. In another aspect, each of the pixels PX may display any one of cyan, magenta, and yellow colors. In various aspects, the pixels PX may be configured to display any one of four or more colors. For example, each of the pixels PX may display any one of red, green, blue, and white colors.

The timing controller 10, the gate driver 20, the data driver 30, and the power supplier 40 may be configured as individual integrated circuits (ICs), respectively, or may be configured as integrated circuits in which at least a part of the timing controller 10, the gate driver 20, the data driver 30, and the power supplier 40 are integrated with each other. For example, at least one of the data driver 30 and the power supplier 40 may be configured to be integrated, as an integrated circuit, with the timing controller 10.

In addition, in FIG. 1, the gate driver 20 and the data driver 30 are illustrated as elements separated from the display panel 50, but at least one of the gate driver 20 and the data driver 30 may be configured to be integrated with the display panel 50 using an in panel method. For example, the gate driver 20 may be configured to be integrated with the display panel 50 using a gate in panel (GIP) method.

Figure 2:
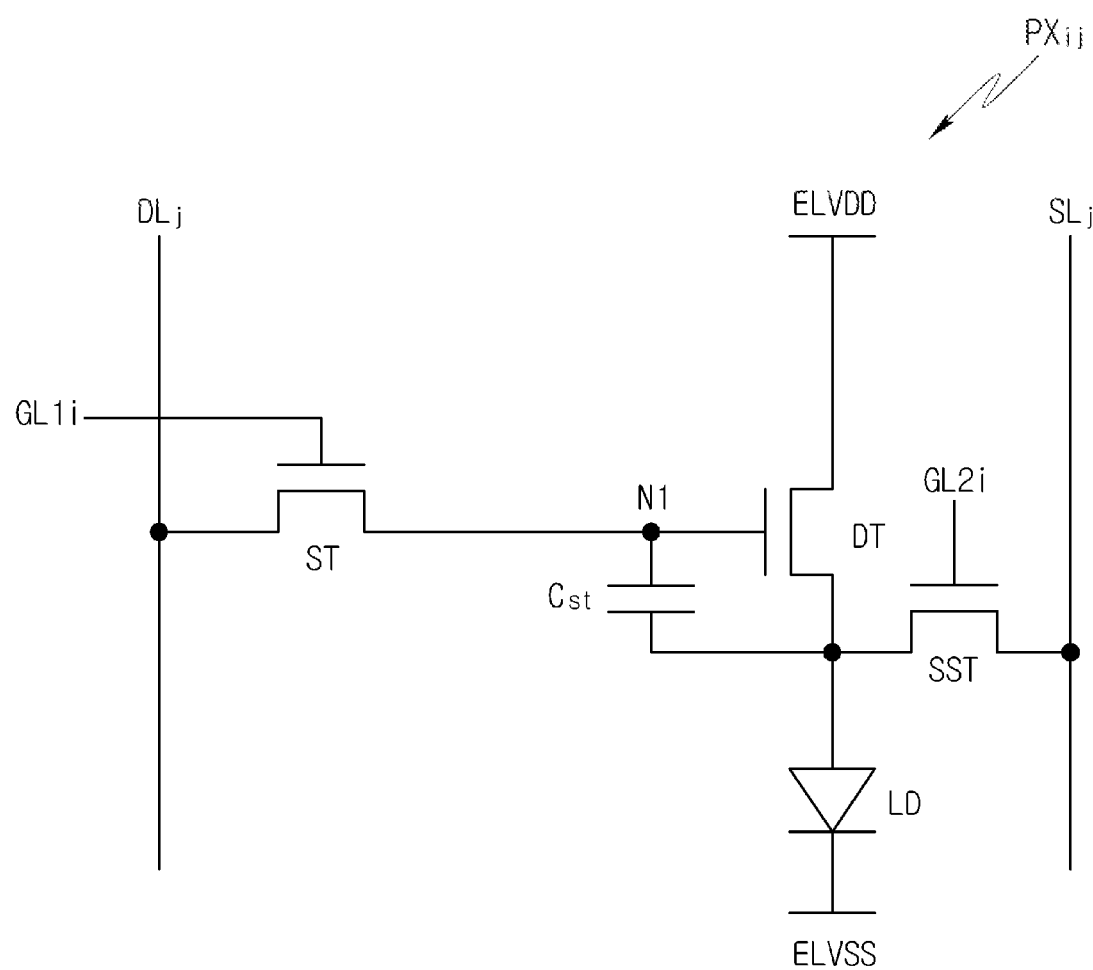
FIG. 2 is a circuit diagram illustrating a pixel according to the present disclosure.

FIG. 2 is a circuit diagram illustrating an example of a pixel illustrated in FIG. 1. FIG. 2 illustrates a pixel PXij, as an example, that is connected to an i-th first gate line GL1$i$ and a j-th data line DLj.

Referring to FIG. 2, the pixel PX includes a switching transistor ST, a driving transistor DT, a sensing transistor SST, a storage capacitor Cst, and a light emitting element LD.

A first electrode (e.g., a source electrode) of the switching transistor ST is electrically connected to the j-th data line DLj, and a second electrode thereof (e.g., a drain electrode) is electrically connected to a first node N1. A gate electrode of the switching transistor ST is electrically connected to the i-th first gate line GL1$i$. When the gate signal at a gate-on level is applied to the i-th first gate line GL1$i$, the switching transistor ST is turned on and transmits to the first node N1 a data signal that is applied to the j-th data line DLj.

A first electrode of the storage capacitor Cst is electrically connected to the first node N1, and a second electrode thereof is connected to a first electrode of the light emitting element LD. The storage capacitor Cst may be charged with a voltage corresponding to a difference between a voltage applied to the first node N1 and a voltage applied to the first electrode of the light emitting element LD.

A first electrode (e.g., a source electrode) of the driving transistor DT is configured to receive the high potential driving voltage ELVDD, and a second electrode thereof (e.g., a drain electrode) is electrically connected to the first electrode (e.g., an anode electrode) of the light emitting element LD. A gate electrode of the driving transistor DT is electrically connected to the first node N1. When a voltage at the gate-on level is applied through the first node N1, the driving transistor DT is turned on, and thus may control the amount of driving current that flows through the light emitting element LD in response to a voltage provided to the gate electrode.

A first electrode (e.g., a source electrode) of the sensing transistor SST is electrically connected to a j-th sensing line SLj, and a second electrode thereof (e.g., a drain electrode) is electrically connected to the first electrode (e.g., the anode electrode) of the light emitting element LD. A gate electrode of the sensing transistor SST is electrically connected to an i-th second gate line GL2$i$. When the sensing signal at the gate-on level is applied to the i-th second gate line GL2$i$, the sensing transistor SST is turned on and transmits to the first electrode of the light emitting element LD the reference voltage applied to the j-th sensing line SLj.

The light emitting element LD outputs light corresponding to the driving current. The light emitting element LD may output light corresponding to any one of red, green, blue, and white colors. The light emitting element LD may be an organic light emitting diode (OLED) or a micro inorganic light emitting diode having a size ranging from micro to nano scale, but the aspect of the present disclosure is not limited thereto. Hereinafter, the technical idea of the aspect of the present disclosure will be described with reference to the aspect in which the light emitting element LD is configured as the organic light emitting diode.

In the aspect of the present disclosure, the structure of the pixel PXij is not limited to that illustrated in FIG. 2. In an aspect, the pixel PXij may further include at least one element for compensating for the threshold voltage of the driving transistor DT or initializing the voltage of the gate electrode of the driving transistor DT and/or the voltage of the first electrode of the light emitting element LD.

An example where the switching transistor ST, the driving transistor DT, and the sensing transistor SST are NMOS transistors is illustrated in FIG. 2, but the present disclosure is not limited thereto. For example, at least a part or all of transistors constituting each of the pixels PXs may be configured as PMOS transistors. In various aspects, each of the switching transistor ST, the driving transistor DT, and the sensing transistor SST may be configured as a low temperature polysilicon (LTPS) thin film transistor, an oxide thin film transistor, or a low temperature polycrystalline oxide (LTPO) thin film transistor.

Figure 3:
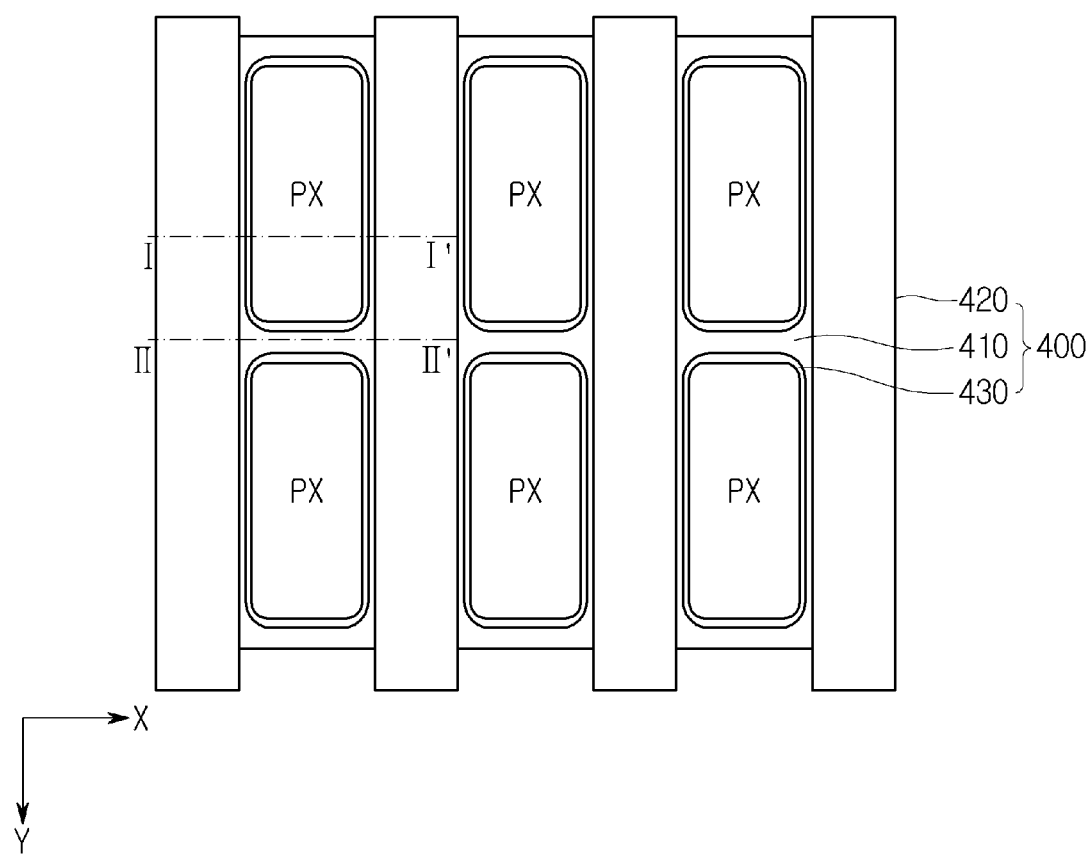
FIG. 3 is a schematic plan view illustrating a region of a display panel according to the present disclosure.
Figure 4:
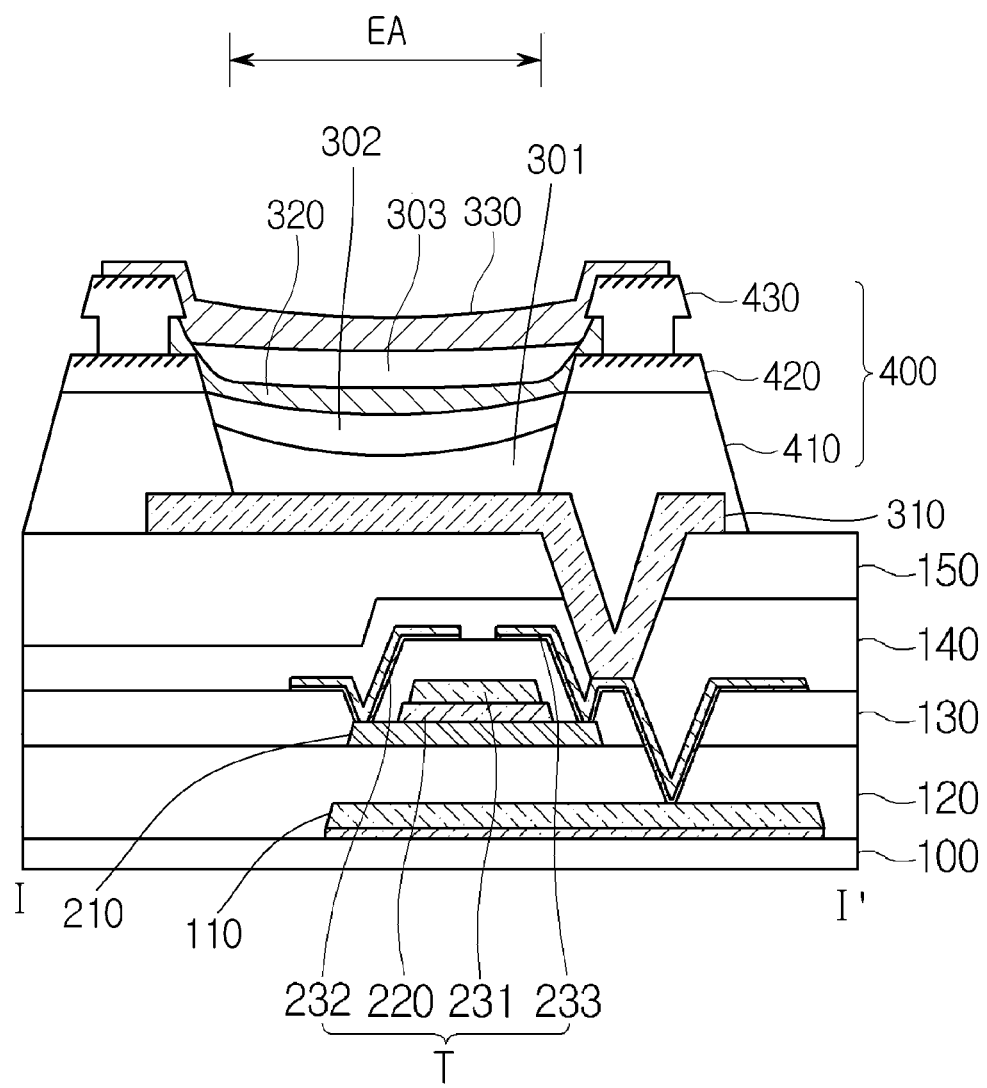
FIG. 4 is a cross-sectional view taken along line I-I' of FIG. 3.
Figure 5:
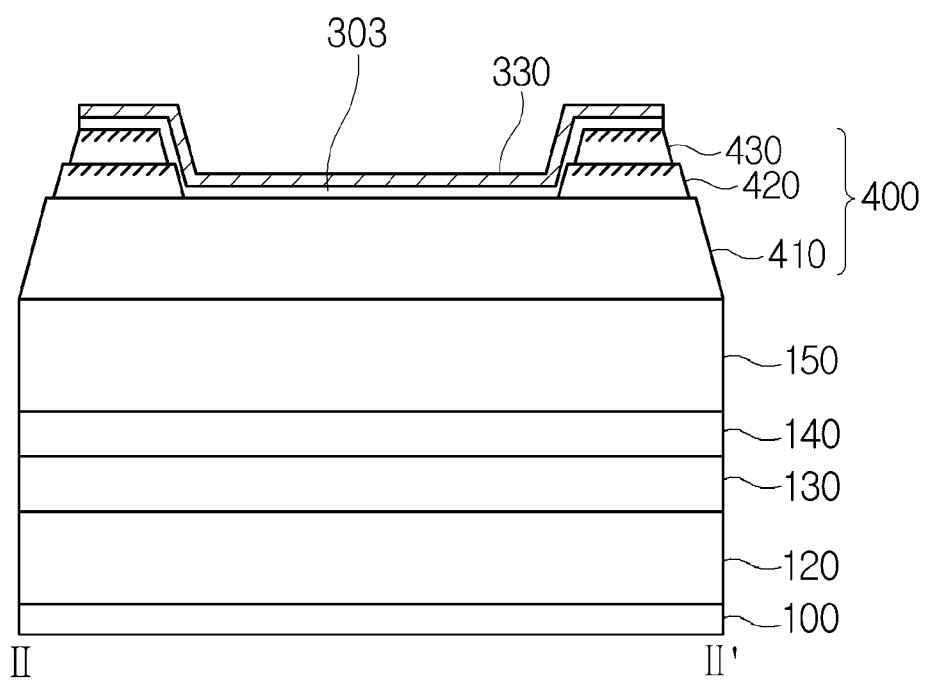
FIG. 5 is a cross-sectional view taken along line II-IUI' of FIG. 3.

FIG. 3 is a schematic plan view illustrating a region of a display panel. FIG. 4 is a cross-sectional view taken along line I-I' of FIG. 3, and FIG. 5 is a cross-sectional view taken along line II-II' of FIG. 3.

As described with reference to FIG. 1, the display panel 50 may include the pixels PXs each displaying one of first to third colors. For example, the pixels PX may include first pixels displaying a red color, second pixels displaying a green color, and third pixels displaying a blue color. In this case, the pixels displaying the same color may be disposed in one pixel column on the display panel 50. For example, the first pixels may be disposed in a first pixel column, the second pixels may be disposed in a second pixel column, and the third pixels may be disposed in a third pixel column.

Referring to FIG. 4, the display panel 50 may include a substrate 100, a circuit element layer formed on the substrate 100 and provided with at least one circuit element, and a light emitting element layer provided with the light emitting element LD.

The substrate 100 serves as a base member of the display panel 50 and may be a light transmitting substrate. The substrate 100 may be a rigid substrate containing glass or tempered glass or may be a flexible substrate made of a plastic material.

The circuit element layer may be formed on the substrate 100 and may include circuit elements (e.g., a transistor and a capacitor, etc.) that constitute the pixel PX, and wiring lines.

In an aspect of the present disclosure, a light blocking layer 110 may be formed on the substrate 100. The light blocking layer 110 may be disposed to overlap with an active layer 210 of a transistor T, particularly a channel region formed in the active layer 210 on a plane and thus may protect the light emitting element from the external light.

The light blocking layer 110 may be covered by a buffer layer 120. The buffer layer 120 may prevent ions or impurities from being diffused from the substrate 100 to the circuit element layer and may block moisture penetration.

The active layer 210 may be formed on the buffer layer 120. The active layer 210 may be made of a silicon-based semiconductor material or an oxide-based semiconductor material. The active layer 210 may include a source region containing p-type impurities, a drain region containing n-type impurities, and a channel region formed between the source region and the drain region.

A gate insulating layer 220 may be formed on the active layer 210. The gate insulating layer 220 may be formed on the channel region of the active layer 210. The gate insulating layer 220 may be a silicon oxide (SiOx) layer, a silicon nitride (SiNx) layer, or a multilayer thereof.

A gate electrode 231 may be formed on the gate insulating layer 220. The gate electrode 231 may be disposed at a position corresponding to the channel region of the active layer 210.

An interlayer insulating layer 130 may be formed on the gate electrode 231. The interlayer insulating layer 130 may cover the gate electrode 231, portions of the active layer 210 which are not covered by the gate electrode 231, and portions of the buffer layer 120 on which the active layer 210 is not formed. The interlayer insulating layer 130 may be one of a silicon oxide (SiOx) film, a silicon nitride (SiNx) film, and a multilayer thereof.

A source electrode 232 and a drain electrode 233 may be formed on the interlayer insulating layer 130. The source electrode 232 and the drain electrode 233 may be connected to the source region and drain region of the active layer 210, respectively, through contact holes passing through the interlayer insulating layer 130.

The gate electrode 231, the source electrode 232, the drain electrode 233, and the active layer 210 corresponding thereto may constitute the transistor T. The transistor T, for example, may be a driving transistor DT or a switching transistor ST. In FIG. 4, the driving transistor DT in which the drain electrode 233 is connected to a first electrode 310 of the light emitting element LD is illustrated as an example.

A passivation layer 140 may cover the source electrode 232, and the drain electrode 233 formed on the interlayer insulating layer 130. The passivation layer 140 is an insulating film for protecting elements below and may be made of an inorganic material or an organic material.

An overcoat layer 150 may be formed on the passivation layer 140. The overcoat layer 150 may be a planarization film for alleviating the step of a lower structure. The overcoat layer 150 may be made of an organic material such as polyimide, benzocyclobutene series resin, or acrylate.

The light emitting element layer is formed on the overcoat layer 150 and includes light emitting elements LD. Each of the light emitting elements LD includes the first electrode 310, an emission layer 320, and a second electrode 330. The first electrode 310 may be an anode electrode and the second electrode 330 may be a cathode electrode.

The first electrode 310 is formed on the overcoat layer 150. The first electrode 310 is connected to the drain electrode 233 of the transistor T through a via hole passing through the overcoat layer 150 and the passivation layer 140.

A bank 400 is further formed on the overcoat layer 150. The bank 400 may be a defining film that defines emission areas EA of the pixels PX. The bank 400 is configured to cover a portion of the edge of the first electrode 310, and an exposed portion of the first electrode 310 which is not covered by the bank 400 may be defined as an emission area EA of each of the pixels PX. In the emission area EA, the first electrode 310, the emission layer 320, and the second electrode 330 are stacked to be in direct contact with each other.

In the aspect of the present disclosure, the bank 400 may be composed of at least three layers of banks having hydrophilic and/or hydrophobic properties. For example, the bank 400 may include a hydrophilic first bank 410, and a second bank 420 and a third bank 430 each having at least one hydrophobic portion. The respective hydrophobic portions of the second bank 420 and the third bank 430 are patterned with diagonal lines in the drawing. The bank 400 may be composed of at least three layers of banks having hydrophilic and/or hydrophobic properties. For example, the bank 400 may include a hydrophilic first bank 410, and a second bank 420 and a third bank 430 each having at least one hydrophobic portion. The respective hydrophobic portions of the second bank 420 and the third bank 430 are patterned with diagonal lines in the drawing.

The first bank 410 has a hydrophilic property. For example, the first bank 410 may be made of an inorganic insulation material such as silicon oxide.

The first bank 410 is configured to surround the respective pixels PX. In other words, the first bank 410 is disposed around the emission areas EA of the respective pixels PX. In this case, the first bank 410 may be disposed to cover a portion of the edge of the first electrode 310 of each of the pixels PX. In an aspect, the first bank 410 may have a tapered shape having an inclined side surface.

The first bank 410 may have a grid shape extending between pixel rows and between pixel columns. That is, the first bank 410 may extend between the pixel columns in a column direction Y as well as between the pixel rows in a row direction X.

Since the first bank 410 has a hydrophilic property, when a solution for forming the emission layer 320 is applied on the bank 400, the solution may easily spread along the side surface of the first bank 410.

The second bank 420 is formed on the first bank 410. The second bank 420 may be a defining film that separates each of the pixel columns. The second bank 420 is formed on the first bank 410 extending in the column direction Y between the pixel columns.

The second bank 420 is configured such that at least a portion thereof has a hydrophobic property. In an aspect, the second bank 420 may be formed by applying a solution in which a hydrophobic material such as fluorine is mixed with a hydrophilic organic insulation material, and then patterning through a photolithography process. The light irradiated during the photolithography process may cause the hydrophobic material such as fluorine to move to an upper portion of the second bank 420, with the result that an upper surface of the second bank 420 may have a hydrophobic property. However, the aspect of the present disclosure is not limited thereto, and the second bank 420 may be configured such that the entire portion thereof has a hydrophobic property.

When the solution for forming the emission layer 320 is applied on the display panel 50, the solution is divided into separate portions between the pixel columns by the hydrophobic second bank 420. Thus, the second bank 420 may prevent color mixing between the pixel columns.

In the illustrated aspect, the second bank 420 may have a tapered shape having an inclined side surface. As the second bank 420 has a tapered shape, the solution may be more effectively divided between adjacent pixel columns, so that the separate portions of the solution may be prevented from being mixed.

The second bank 420 may be configured to have a smaller thickness than the first bank 410, but is not limited thereto. In addition, the second bank 420 may be configured to have a narrower width than the first bank 410.

The third bank 430 is formed on the second bank 420. As in the case of the second bank 420, the third bank 430 may be formed on the second bank 420 extending in the column direction Y between the pixel columns.

In the illustrated aspect, the third bank 430 may have a T shape in which an upper portion thereof has a larger area than a lower portion thereof. The upper portion of the third bank 430 may have an area smaller than that of the second bank 420. In addition, in an aspect, the upper portion of the third bank 430 may have a tapered shape having an inclined side surface. However, the aspect of the present disclosure is not limited thereto.

In the aspect of the present disclosure, a hole H that is not exposed upward by the upper portion of the third bank 430 may be formed between the third bank 430 and the second bank 420.

As in the case of the second bank 420, the third bank 430 may be configured such that at least a portion thereof has a hydrophobic property. In an aspect, an upper surface of the third bank 430 may have a hydrophobic property. In this case, the remaining portion including the side surface of the third bank 430 may have a hydrophilic property.

The emission layer 320 is formed on the first electrode 310. The emission layer 320 is formed on a portion of the first electrode 310 that is exposed without being covered by the bank 400. That is, the emission layer 320 may be formed in each of the emission areas EA defined by the bank 400.

The emission layer 320 may have a multilayer thin film structure including a light generation layer. For example, the emission layer 320 may include a hole transport layer (HTL), the light generation layer, and an electron transport layer (ETL). In addition, the emission layer 320 may further include a hole injection layer (HIL), a hole blocking layer (HBL), an electron injection layer (EIL), and an electron blocking layer (EBL).

In the aspect of the present disclosure, the emission layer 320 may be formed through a solution process using an inkjet device. That is, the emission layer 320 may be formed by applying the solution for forming the emission layer 320 in a region surrounded by the bank 400, and then drying the applied solution to thereby form the emission layer 320.

When the emission layer 320 is formed through the solution process, a difference in surface height may occur between a central portion of the emission layer 320 and an edge portion thereof adjacent to the bank 400 due to tension between the solution and the bank 400 (pile-up phenomenon). For example, the emission layer 320 may be formed in a concave shape that is thinnest at the center and thickest at the ends being in contact with the bank 400.

Such unevenness of the surface of the emission layer 320 may reduce the light emission efficiency of the light emitting element LD and degrade the performance of the display panel 50. In order to prevent this problem, in aspects, the bank 400 may include the hydrophilic first bank 410, the second bank 420 formed on the first bank 410, and the third bank 430 formed on the second bank 420. At least one of the second bank 420 and the third bank 430 may have a special shape to improve the flatness of the emission layer 320 in the emission area EA.

In one aspect, before and/or after the emission layer 320 is formed, each of solutions for forming at least one functional layer, for example, the hole injection layer 301, the hole transport layer 302, and the electron transport layer 303, may be sequentially laminated through application and drying processes.

In this case, since the first bank 410 has a hydrophilic property, the solution may be evenly spread along the bank 400 in the pixel column direction. In addition, since the second bank 420 has a hydrophobic property, the separate portions of the solution are prevented from being mixed between adjacent pixel columns on opposite sides of the bank 400.

When the solution for forming the emission layer 320 is dried, the solution may flow into the hole H between the third bank 430 and the second bank 420. In particular, when the side surface of the third bank 430 has a hydrophilic property, the solution may be efficiently confined in the hole H. As a result, an edge portion of the solution may be dried inside the hole H. After the solution is dried, the surface height of the edge portion of the emission layer 320 is higher than that of the central portion thereof due to the pile-up phenomenon. For example, a thin film stacked under the emission layer 320 may be configured such that an edge portion thereof is thicker than a central portion thereof. In this case, the edge portion is not exposed upward because it is disposed in the hole H of the first bank 410, and the central portion thereof that is exposed to the top of the first bank 410 and constitutes the emission area EA may have a flat surface.

Due to the flow of the solution as described above, a portion of the emission layer 320 formed after the solution is dried may be formed in the hole H between the second bank 420 and the third bank 430. In this case, the emission layer 320 may be discontinuous at the periphery of the second bank 420.

Specifically, the emission layer 320 may include a first portion formed on the emission area EA and a second portion formed inside the hole H. The first portion and the second portion may be separated from each other near the edge of the second bank 420. However, the aspect of the present disclosure is not limited thereto, and the first portion and the second portion of the emission layer 320 may be integrally continuously formed with each other.

FIGS. 6A to 6H are views illustrating a method of forming a bank according to an aspect. In FIGS. 6A to 6H, only a portion of the light emitting element layer is illustrated in order to better reveal the characteristics of the aspect. Hereinafter, the aspect will be described with reference to FIGS. 3 to 5 together with FIGS. 6A to 6H.

Figure 6A:
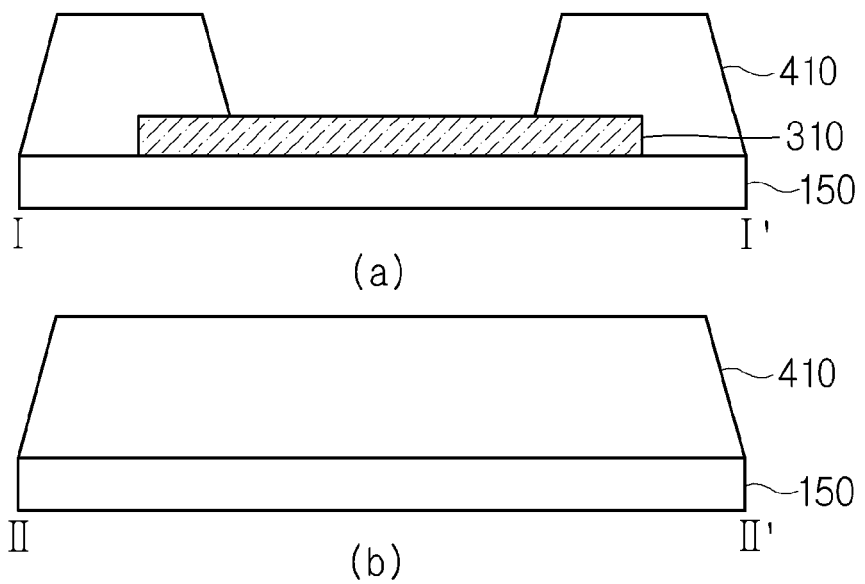
FIGS. 6A to 6H are cross-sectional views illustrating a method of forming a bank according the present disclosure.

First, referring to FIG. 6A, a first bank 410 may be formed on a first electrode 310 of a light emitting element LD. The first bank 410 may be made of a hydrophilic material. For example, the first bank 410 may be formed by patterning an inorganic insulating material such as silicon oxide. In an aspect, the first bank 410 may be patterned in a tapered shape having an inclined side surface.

The first bank 410 is formed to cover the edge of the first electrode 310 and expose the remaining portion thereof to define an emission area EA of each of pixels PX. For example, the first bank 410 may have a grid shape extending between pixel rows and between pixel columns. That is, the first bank 410 may extend between the pixel columns in a column direction Y as well as between the pixel rows in a row direction X.

In FIG. 6A, it is illustrated that the first bank 410 is formed on a portion of the first electrode 310 for convenience. However, as illustrated in FIGS. 4 and 5, the first bank 410 may be formed on an overcoat layer 150 while covering a portion of the edge of the first electrode 310.

Figure 6B:
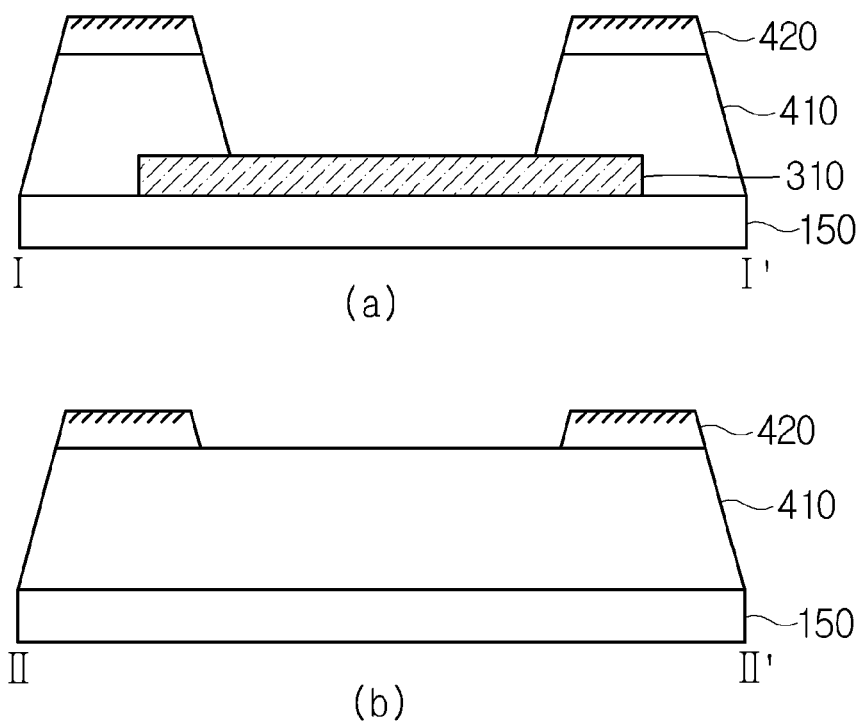

Thereafter, as illustrated in FIG. 6B, a second bank 420 may be formed on the first bank 410. The second bank 420 may be formed by applying a solution in which a hydrophobic material such as fluorine is mixed with a hydrophilic organic insulation material, and then patterning through a photolithography process. The light irradiated during the photolithography process may cause the hydrophobic material such as fluorine to move to an upper portion of the second bank 420, with the result that an upper surface of the second bank 420 may have a hydrophobic property.

In an aspect, the second bank 420 may have a tapered shape having an inclined side surface. The second bank 420 may be configured to have a smaller thickness than the first bank 410, but is not limited thereto. In addition, the second bank 420 may be configured to have a narrower width than the first bank 410.

Figure 6C:
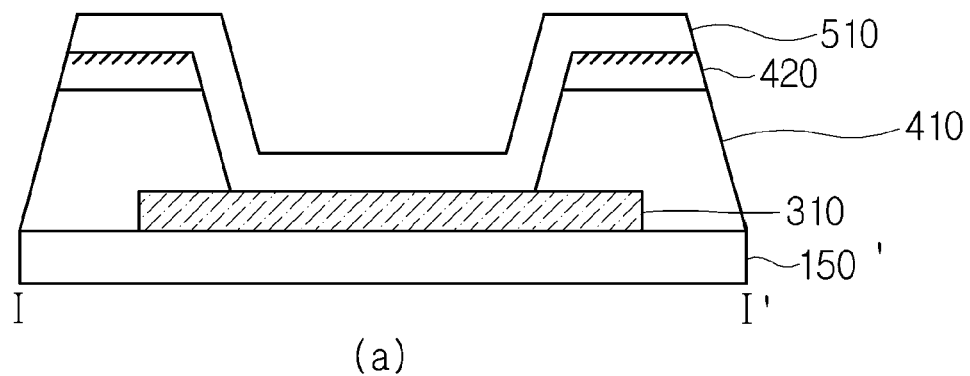
Figure 6C:
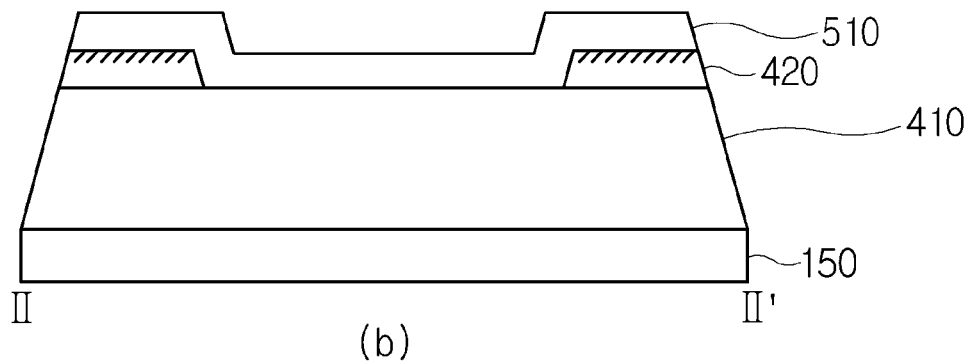

Thereafter, as illustrated in FIG. 6C, a buffer layer 510 may be formed on a display panel 50. In addition, the buffer layer 510 may be patterned to expose at least a portion of each of the first bank 410 and the second bank 420.

Figure 6D:
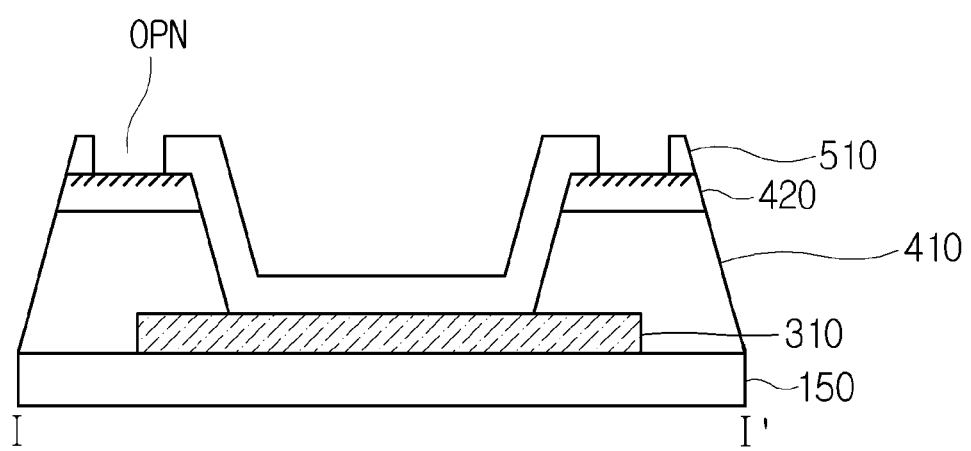
Figure 6D:
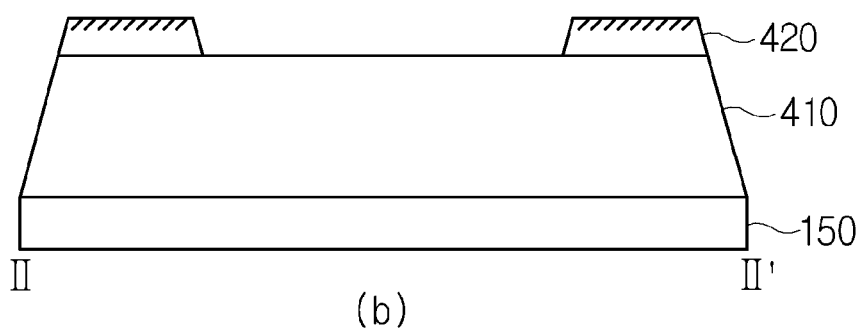
Figure 6E:
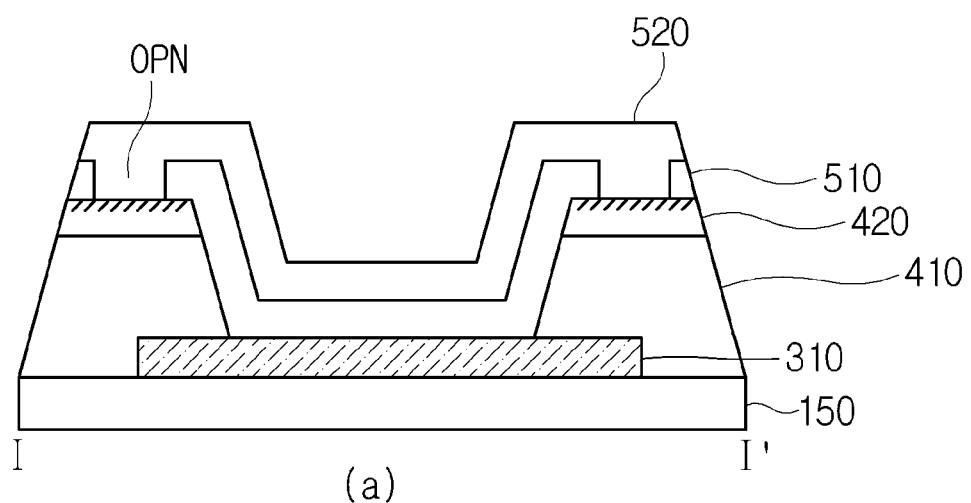
Figure 6E:
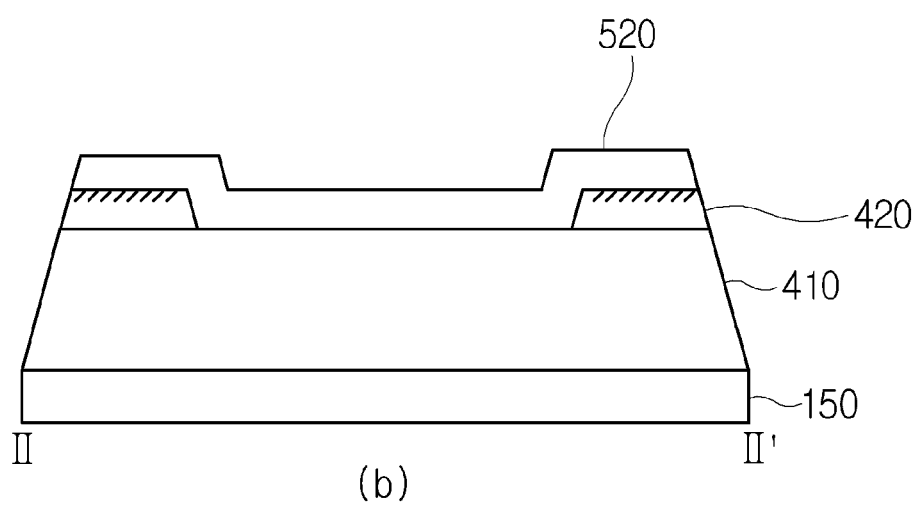

For example, as illustrated in (a) of FIG. 6D, the buffer layer 510 may be patterned to expose at least a portion of the second bank 420 extending along the column direction Y between the pixel columns. As the buffer layer 510 is patterned, an opening OPN through which the at least a portion of the second bank 420 is exposed may be formed.

In addition, as illustrated in (b) of FIG. 6D, the buffer layer 510 may be patterned to expose the first bank 410 extending in the row direction X between the pixel rows, and the second bank 420 on the first bank 410 extending in the row direction X.

Thereafter, a third bank 430 may be formed on the display panel 50. First, as illustrated in (a) and (b) of FIG. 6E, an organic insulating layer 520 may be formed on the entire surface of the display panel 50. The organic insulating layer 520 may be formed by applying a solution in which a hydrophobic material such as fluorine is mixed with an organic insulating material having a hydrophilic property on the display panel 50. In this case, a portion of the organic insulating layer 520 may fill the opening OPN.

Figure 6F:
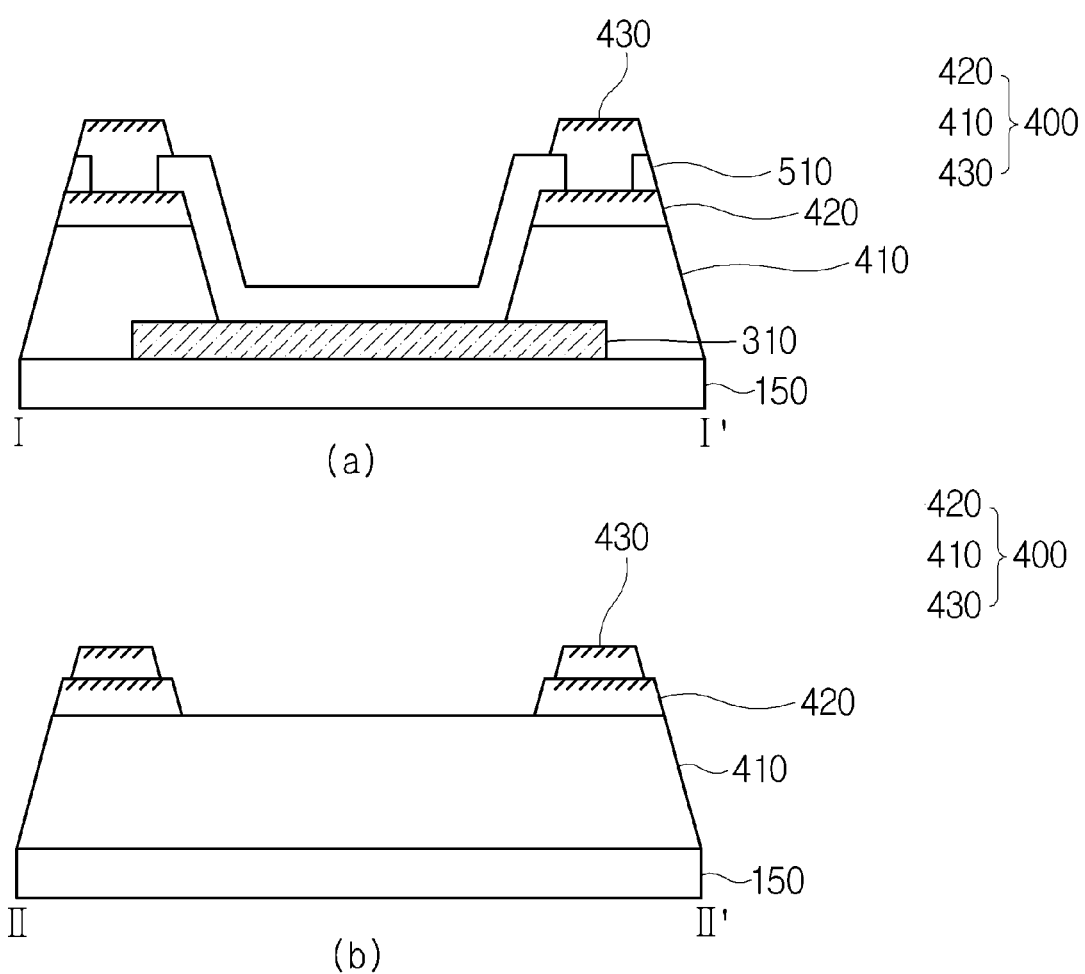

Thereafter, as illustrated in (a) and (b) of FIG. 6F, the organic insulating layer 520 is patterned to form the third bank 430. For example, as illustrated in (a) of FIG. 6F, the organic insulating layer 520 may be patterned such that only a portion thereof covering the opening OPN between the pixel columns remains and the remaining portion thereof is removed. In this case, the remaining portion has a larger area than the opening OPN. In addition, the remaining portion may have a smaller area than the second bank 420. Here, the remaining portion may constitute an upper portion of the third bank 430, and the portion filling the opening OPN may constitute a lower portion of the third bank 430.

In addition, as illustrated in (b) of FIG. 6F, the organic insulating layer 520 may be patterned to remain on the second bank 420 between the pixel rows.

Thereafter, a photolithography process may be performed to cause the hydrophobic material contained in the organic insulating layer 520 to move to an upper surface thereof. As a result, the surface of the patterned organic insulating layer 520 may have a hydrophobic property.

Figure 6G:
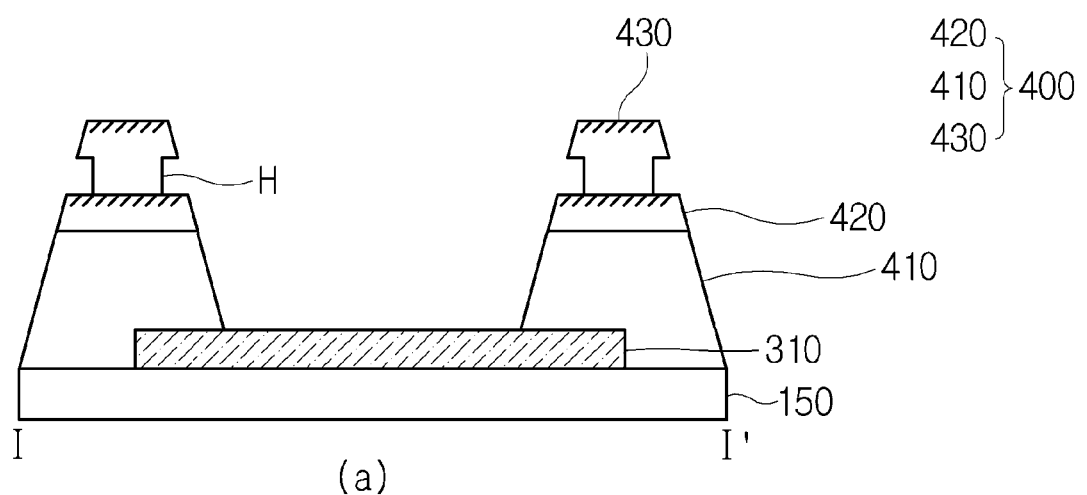
Figure 6G:
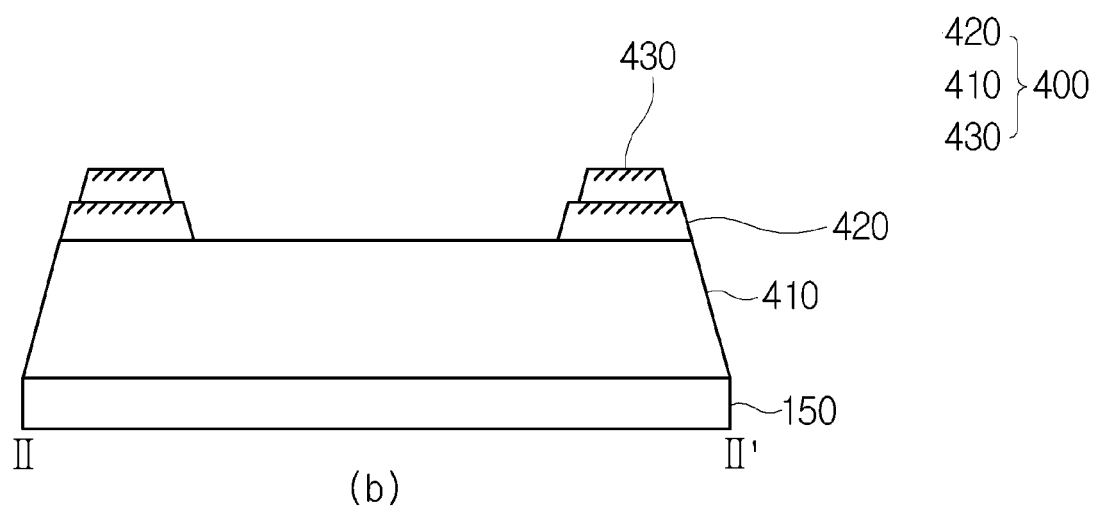

Thereafter, as illustrated in (a) and (b) of FIG. 6G, the buffer layer 510 remaining on the display panel 50 is removed to complete the formation of the first bank 410, the second bank 420, and the third bank 430. The third bank 430 thus formed may have a T shape in which an upper portion thereof has a larger area than a lower portion thereof.

As a result of removing the buffer layer 510, a hole H that is not exposed upward may be formed between the upper surface of the second bank 420 and the upper portion of the third bank 430. In other words, the hole H may be formed around a side surface of the lower portion of the third bank 430.

After the bank 400 is formed as described above, as illustrated in (a) of FIG. 6H, an emission layer 320 may be further formed. For example, on the emission areas EA defined by the bank 400, each of solutions for forming a hole injection layer 301 and a hole transport layer 302 may be sequentially laminated through application and drying processes. Thereafter, a solution (organic light emitting material) for forming the emission layer 320 is applied in the emission area EA. While the solution is dried, the solution may flow into the hole H. When the drying is completed, an edge portion of the emission layer 320 is disposed inside the hole H. In this case, the surface height of the edge portion of the emission layer 320 may be higher than that of a central portion thereof due to the pile-up phenomenon. However, since the edge portion of the emission layer 320 is formed inside the hole H that is not exposed upward, the central portion thereof constituting the emission area EA may have a substantially flat surface.

The central portion of the emission layer 320 formed on the emission area EA and the edge portion of the emission layer 320 formed inside the hole H may be separated from each other near the edge of the second bank 420. However, the aspect of the present disclosure is not limited thereto, and a first portion and a second portion of the emission layer 320 may be integrally continuously formed with each other.

Thereafter, a solution for forming the electron transport layer 303 may be laminated on the emission layer 320 through application and drying processes. The electron transport layer 303 may be formed on the entire surface of the display panel 50.

Figure 6H:
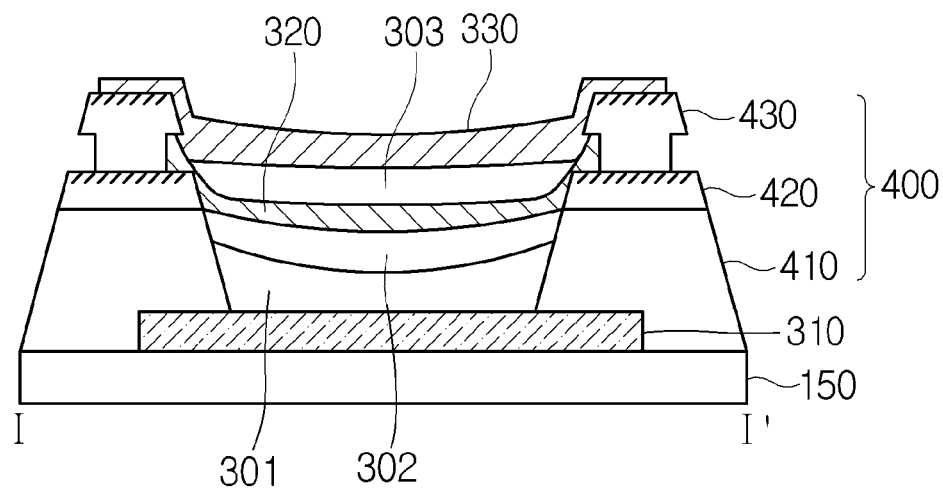
Figure 6H:
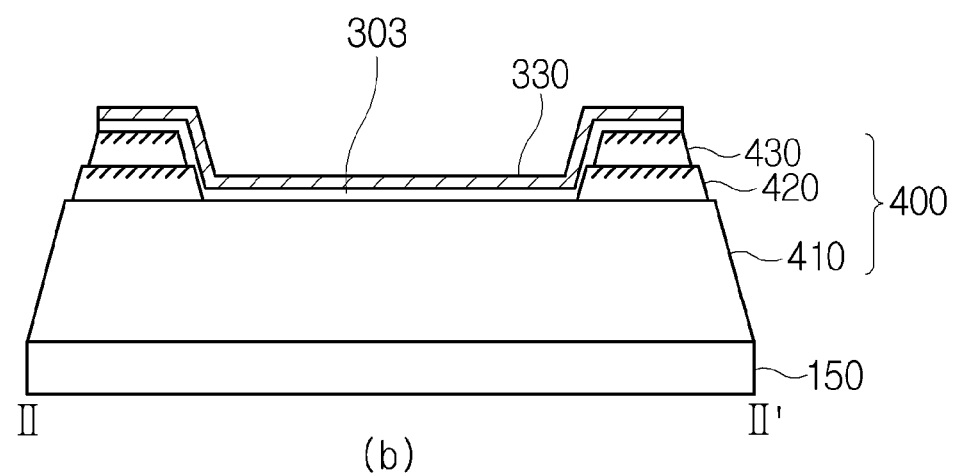

After the emission layer 320 is formed, as illustrated in (a) and (b) of FIG. 6H, a second electrode 330 may be formed on the entire surface of the display panel 50. The first electrode 310, the emission layer 320, and the second electrode 330 stacked in the emission area EA may constitute the light emitting element LD.

In the above, the aspects have been described in which the third bank 430 has a T shape. In addition, the aspects have been described in which the edge portion of the emission layer 320 is disposed in the hole H. However, the aspects of the present disclosure are not limited thereto. For example, the second bank 420 may also be formed to have a T shape, or only the second bank 420 may be formed to have a T shape instead of the third bank 430. Alternatively, an additional bank other than the first to third banks 410 to 430 may be further formed, or the edge portion of the emission layer 320 may be disposed outside the hole H.

Hereinafter, the above additional aspects will be described in more detail.

FIGS. 7 to 11 are cross-sectional views taken along line I-I' of display panels according to various aspects. In describing aspects of FIGS. 7 to 11, the same descriptions for those of FIGS. 3 to 6H will be omitted.

In an aspect, an emission layer 321 may be formed only outside a hole H in accordance with the relative heights of functional layers under the emission layer 321 and first to third banks 510, 520, and 530.

Figure 7:
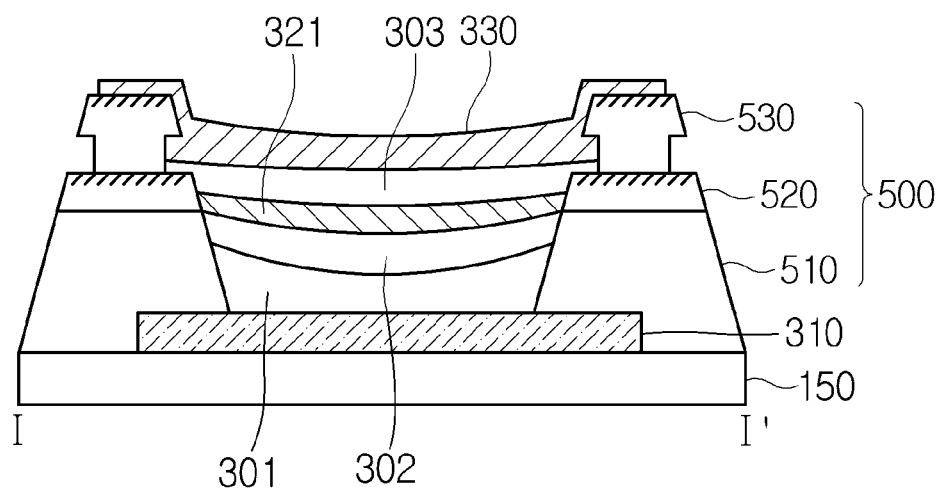
FIGS. 7 to 11 are cross-sectional views taken along line I-I' of display panels according to various aspects of the present disclosure.

In the aspect of FIG. 7, the thickness of the third bank 530 is smaller than that thereof in the aspect of FIG. 6. Therefore, the size of the hole H is relatively smaller than that thereof in the aspect of FIG. 6. As a result, while a solution applied to form the emission layer 321 is dried, the amount of the solution flowing into the hole H may be reduced, and the amount of the organic light emitting material remaining inside the hole H after drying may be absent or very small. Thus, the emission layer 321 may be formed only in an emission area EA. That is, an edge portion of the emission layer 321 may be in contact with a side surface of the second bank 520.

Figure 8:
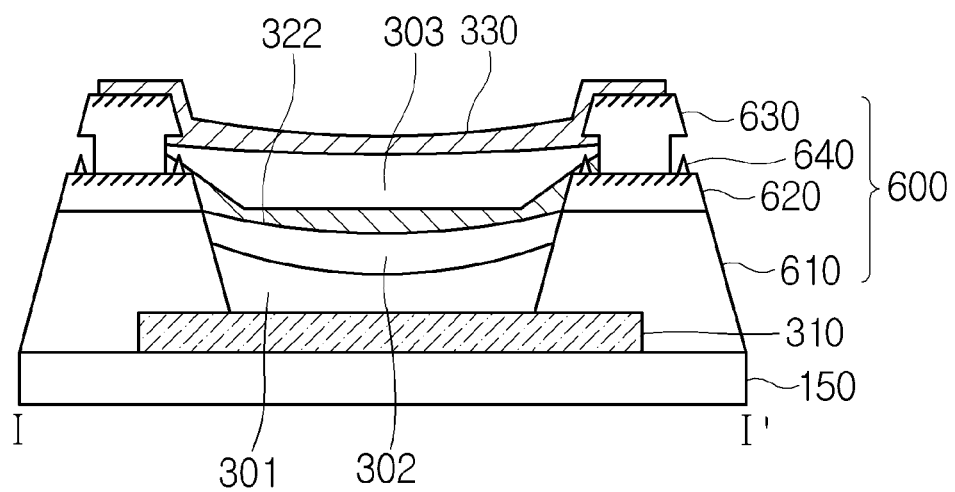

In the aspect of FIG. 8, a bank 600 further includes a fourth bank 640. The fourth bank 640 may be formed on a second bank 620 to be spaced apart from a third bank 630. For example, the fourth bank 640 may be formed on one or each of opposite sides of an edge portion of the second bank 620. In this aspect, a hole H is surrounded by the second bank 620, the third bank 630, and the fourth bank 640. The fourth bank 640 may have a smaller thickness than a lower portion of the third bank 630, but the aspect of the present disclosure is not limited thereto.

When a solution for forming an emission layer 322 is applied, a portion of the solution may be more efficiently confined in the hole H by the fourth bank 640. As a result, an edge portion of the solution may be dried inside the hole H. After the solution is dried, the surface height of an edge portion of the emission layer 322 is higher than that of a central portion thereof due to the pile-up phenomenon. In this case, the edge portion is not exposed upward because it is disposed in the hole H of the first bank 610, and the central portion thereof that is exposed to the top of the first bank 610 and constitutes an emission area EA may have a flat surface.

The thickness of the third bank 630 is smaller than that thereof in the aspect of FIG. 6. Therefore, the size of the hole H is relatively smaller than that thereof in the aspect of FIG. 6. As a result, while the solution applied to form the emission layer 322 is dried, the amount of the solution flowing into the hole H may be reduced, and the amount of the organic light emitting material remaining inside the hole H after drying may be absent or very small. Thus, the emission layer 322 may be formed only in the emission area EA.

Meanwhile, in the aspect of FIG. 8, the emission layer 322 is discontinuous on an upper surface of the fourth bank 640 so that an edge portion and a central portion thereof are separated from each other.

Figure 9:
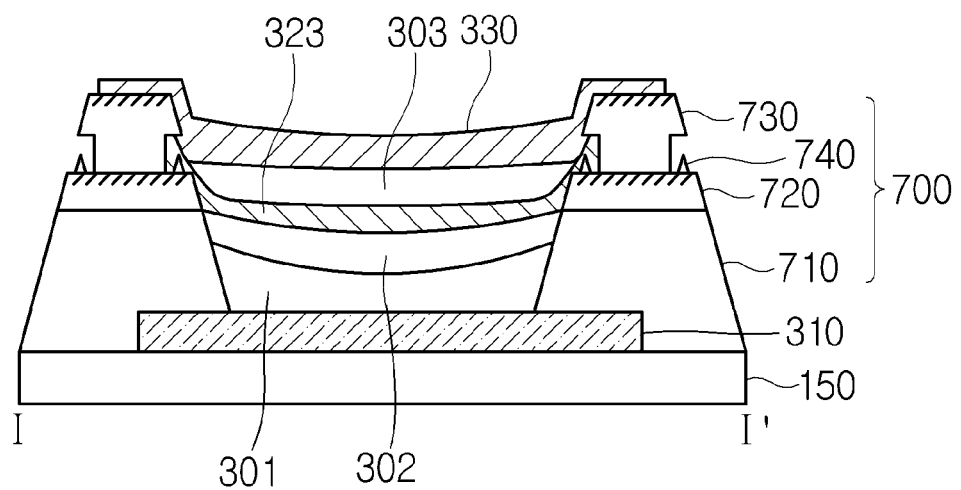

In the aspect of FIG. 9, unlike in the aspect of FIG. 8, an emission layer 323 is continuously formed on an upper surface of a fourth bank 740. When the emission layer 323 is continuously formed as illustrated in FIG. 9, the flatness of the emission layer 323 may be improved compared to the aspect of FIG. 8. As a result, in the aspect of FIG. 9, the flatness of the emission layer 323 may be improved, thereby improving the light emission efficiency of a light emitting element LD.

Figure 10:
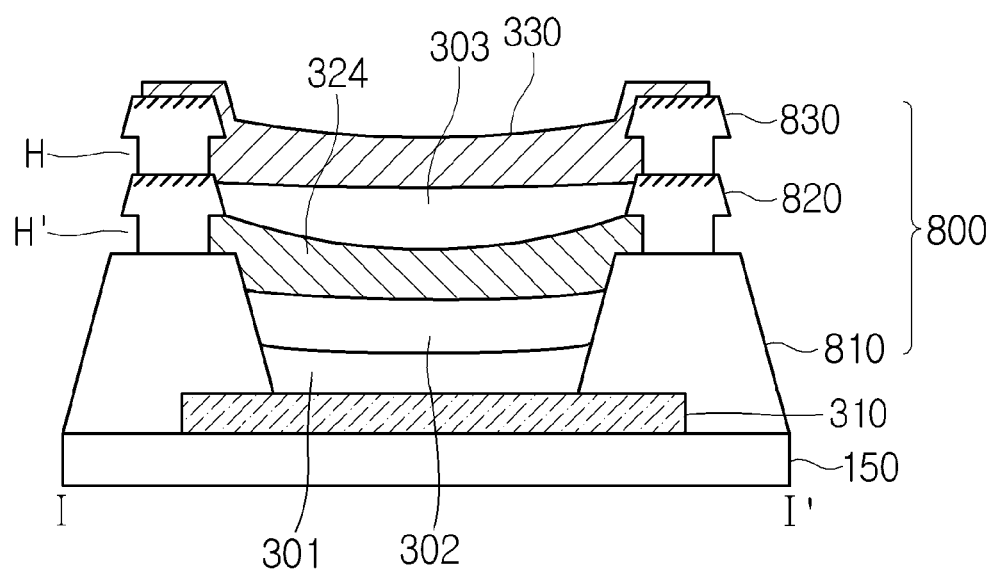

In the aspect of FIG. 10, as in the case of a third bank 830, a second bank 820 may have a T shape in which an upper portion thereof has a larger area than a lower portion thereof. The thicknesses and widths (i.e., the widths of the upper portions and the lower portions) of the second bank 820 and the third bank 830 may be the same as or substantially similar to each other. However, the aspect of the present disclosure is not limited thereto.

When both the second bank 820 and the third bank 830 have a T shape, a solution for forming an emission layer 324 may be confined in a hole H' formed by the second bank 820. As a result, an edge portion of the solution may be dried inside the hole H'. Thus, after drying, an edge portion of the emission layer 324 is not exposed upward because it is disposed in the hole H' of the second bank 820, and a central portion thereof that constitutes an emission area EA may have a flat surface.

As similar in the aspect in which the third bank 830 has a T shape, the emission layer 324 may be continuous or discontinuous at the periphery of a first bank 810.

In the aspect of FIG. 10, the flatness of the emission layer 324 in the emission area EA may be improved by the second bank 820.

Figure 11:
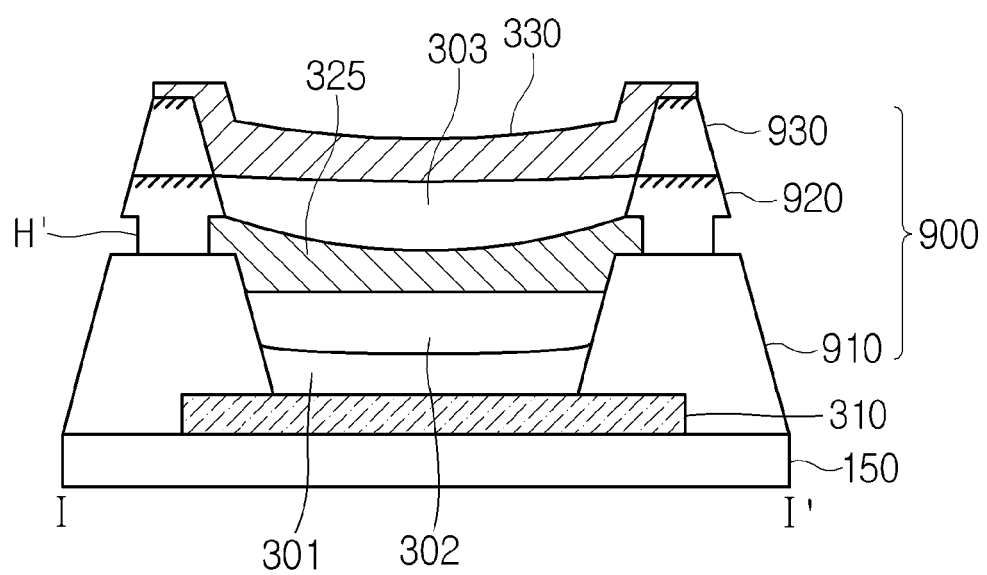

In the aspect of FIG. 11, a third bank 930 may not have a T shape. For example, the third bank 930 may have a shape the same as or substantially similar to that of a first bank 910. For example, the third bank 930 may have a tapered shape having an inclined side surface.

In this aspect, while a solution for forming an emission layer 325 is dried, the solution may flow to the side surface of the third bank 930 having a hydrophilic property. As a result, after drying, a portion of the emission layer 325 may be formed on an upper portion of a second bank 920, i.e., on the side surface of the third bank 930.

In the aspect of FIG. 10, the light generated from the emission layer 324 may be partially reflected by the T-shaped third bank 830, and thus may not be radiated to the outside or may be distorted. On the other hand, in the aspect of FIG. 11, since the third bank 930 has a tapered shape, the light generated from the emission layer 325 may be efficiently radiated to the outside, thereby preventing a deterioration in image quality which may be caused by the shape of the third bank 930.

Those who are ordinarily skilled in the art will appreciate that various alternatives, modifications, and equivalents are possible, without changing the spirit or essential features of the present disclosure. Therefore, aspects of the present disclosure have been described for illustrative purposes, and should not be construed as being restrictive. The scope of the present disclosure is defined by the appended claims rather than the description which is presented above. Moreover, the present disclosure is intended to cover not only the exemplary aspects, but also various alternatives, modifications, equivalents, and other aspects that may be included within the spirit and scope of the present disclosure as defined by the appended claims.

What is claimed is:

1. A display device comprising:
a substrate on which a plurality of pixels are disposed;
a bank defining emission areas of the plurality of pixels; and
an emission layer formed in each of the emission areas,
wherein the bank comprises:
a first bank extended in row and column directions;
a second bank disposed on the first bank and extended in the column direction to separate adjacent pixel columns; and a third bank disposed on the second bank,
wherein the first bank is hydrophilic, and each of the second bank and the third bank has a hydrophobic upper surface.

2. The display device of claim 1, wherein an upper portion of the third bank has a T shape and has an area greater than a lower portion of the third bank, and a first hole is disposed between the second bank and the upper portion of the third bank.

3. The display device of claim 2, wherein the emission layer has an edge portion inside the first hole and has a surface height higher than a central portion of the emission layer.

4. The display device of claim 3, wherein the edge portion and the central portion are continuous or separated from each other at a periphery of the second bank.

5. The display device of claim 3, wherein the edge portion of the emission layer is in contact with a side surface of the second bank.

6. The display device of claim 2, further comprising a fourth bank disposed on the second bank spaced apart from the third bank,
wherein the first hole is surrounded by the second bank, the upper portion of the third bank and the fourth bank.

7. The display device of claim 6, wherein the emission layer has an edge portion inside the first hole and has a surface height higher than a central portion of the emission layer.

8. The display device of claim 7, wherein the edge portion and the central portion are continuous or separated from each other on an upper surface of the fourth bank.

9. The display device of claim 2, wherein an upper portion of the second bank has a T shape and has an area greater than a lower portion of the second bank, and a second hole is disposed between the first bank and the upper portion of the second bank.

10. The display device of claim 9, wherein the emission layer has an edge portion inside the second hole and has a surface height higher than a central portion of the emission layer.

11. The display device of claim 10, wherein each of the first bank and the third bank has a tapered shape having an inclined side surface.

12. A display device comprising:
a plurality of emission areas defined in a display panel;
a hydrophilic bank extended in row and column directions and defining the plurality of emission areas;
a first bank disposed on the hydrophilic bank and extended in the column direction to separate adjacent pixel columns; and
a second bank disposed on the first bank, and the first and second banks have an upper surface with hydrophobic,
wherein each of the first and second banks and the hydrophilic bank has an upper portion having an area greater than a lower portion.

* * * * *